United States Patent
Boerstler et al.

(12)

(10) Patent No.: US 6,973,155 B2
(45) Date of Patent: Dec. 6, 2005

(54) HIGHLY SCALABLE GLITCH-FREE FREQUENCY DIVIDER

(75) Inventors: David William Boerstler, Round Rock, TX (US); Eskinder Hailu, Austin, TX (US); Eric John Lukes, Stewartville, TX (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 10/809,592

(22) Filed: Mar. 25, 2004

(65) Prior Publication Data

US 2005/0213699 A1    Sep. 29, 2005

(51) Int. Cl.[7] ............................................ H03K 21/00
(52) U.S. Cl. ..................... 377/47; 327/115; 327/117; 327/142; 327/146
(58) Field of Search ..................... 327/115, 117, 142, 327/146; 377/47

(56) References Cited

U.S. PATENT DOCUMENTS

| | | |
|---|---|---|
| 4,229,699 A | 10/1980 | Frissell |
| 4,970,405 A | 11/1990 | Hagiwara |
| 5,099,141 A | 3/1992 | Utsunomiya |
| 5,122,677 A | 6/1992 | Sato |
| 5,155,380 A | 10/1992 | Hwang et al. |
| 5,231,636 A | 7/1993 | Rasmussen |
| 5,315,181 A | 5/1994 | Schowe |
| 5,357,146 A | 10/1994 | Heimann |
| 5,489,888 A | 2/1996 | Jagiella et al. |
| 5,729,179 A | 3/1998 | Sumi |
| 5,754,067 A | 5/1998 | Komatsu et al. |
| 5,787,135 A | 7/1998 | Clark |
| 6,157,694 A | 12/2000 | Larsson |
| 6,265,930 B1 | 7/2001 | Walker et al. |
| 6,285,263 B1 | 9/2001 | Anderson |
| 6,501,304 B1 | 12/2002 | Boerstler et al. |
| 6,667,638 B1 * | 12/2003 | Kramer et al. .............. 327/115 |

* cited by examiner

*Primary Examiner*—Margaret R. Wambach
(74) *Attorney, Agent, or Firm*—Carr LLP; Diana R. Gerhardt

(57) ABSTRACT

The present invention provides for a divider circuit for reducing anomalous output timing pulses. A latch is coupled to the division selection line. A comparator is coupled to the division selection line. A first synchronizer coupled to the output of the latch. A frequency divider is coupled to the output of the synchronizer. A second synchronizer is coupled to the output of the comparator and the output of the frequency divider. There is feedback between the output of the second synchronizer and the enable input of the latch, the reset of the first synchronizer, the reset of the second synchronized, and the reset of the divide by n divider.

20 Claims, 5 Drawing Sheets

HIGHLY SCALABLE GLITCH-FREE FREQUENCY DIVIDER

TECHNICAL FIELD

The invention relates generally to frequency dividers and, more particularly, to glitch-free frequency dividers.

BACKGROUND

Frequency division can be generally defined as taking an input clock frequency, and then from that clock signal generating a second frequency signal that is a fraction of that signal. For instance, a 100,000 HZ clock could be frequency divided into a 50,000 HZ output (½) a 25,000 HZ output (¼), 12,500 HZ output (⅛), and so on.

However, problems arise with the use of frequency dividers. One of these problems concerns "switching" a frequency division from one proportion to a second proportion, such as from a 1:4 divider to a 1:10 divider. When the output clock signal is generated, if the selected output clock frequency is to change, the change could happen in the middle of a frequency run. For instance, in a 4 to 1 frequency divider, only 3 of the clock cycles could have occurred, but the frequency divider is ordered to divide at some other proportion other that the 4:1 ratio. This creates a quandary for the circuit designer. Should the circuit be designed to wait until the end of the present clock cycle before switching to the new clock cycle? If the circuit does this, then there would be too few or too many output clock pulses, and any device that relies on the counts the number of output clock cycles would be induced to error. To avoid this, the divider should instead switch to the new frequency at the earliest opportunity.

However, switching at the first opportunity creates further problems. Should the divider lengthen or shorten the outgoing clock pulse (a "glitch") in order to compensate for the change, although the new output clock pulse would be different yet? In other words, should there be a transition clock pulse length, a "glitch" to compensate for the change in timing or ratios? Or should the divider circuit lengthen or shorten the time between clock pulses? If the clock pulses themselves are lengthened or shortened, this can create serious timing errors.

Therefore, there is a need for a divider architecture that addresses at least some of the concerns of conventional divider architecture.

SUMMARY OF THE INVENTION

The present invention provides for a divider circuit for reducing anomalous output timing pulses. A latch is coupled to the division selection line. A comparator is coupled to the division selection line. A first synchronizer coupled to the output of the latch. A frequency divider is coupled to the output of the synchronizer. A second synchronizer is coupled to the output of the first comparator and the output of the frequency divider.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

In the remainder of this description, a processing unit (PU) may be a sole processor of computations in a device. In such a situation, the PU is typically referred to as an MPU (main processing unit). The processing unit may also be one of many processing units that share the computational load according to some methodology or algorithm developed for a given computational device. For the remainder of this description, all references to processors shall use the term MPU whether the MPU is the sole computational element in the device or whether the MPU is sharing the computational element with other MPUs, unless otherwise indicated.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1A:
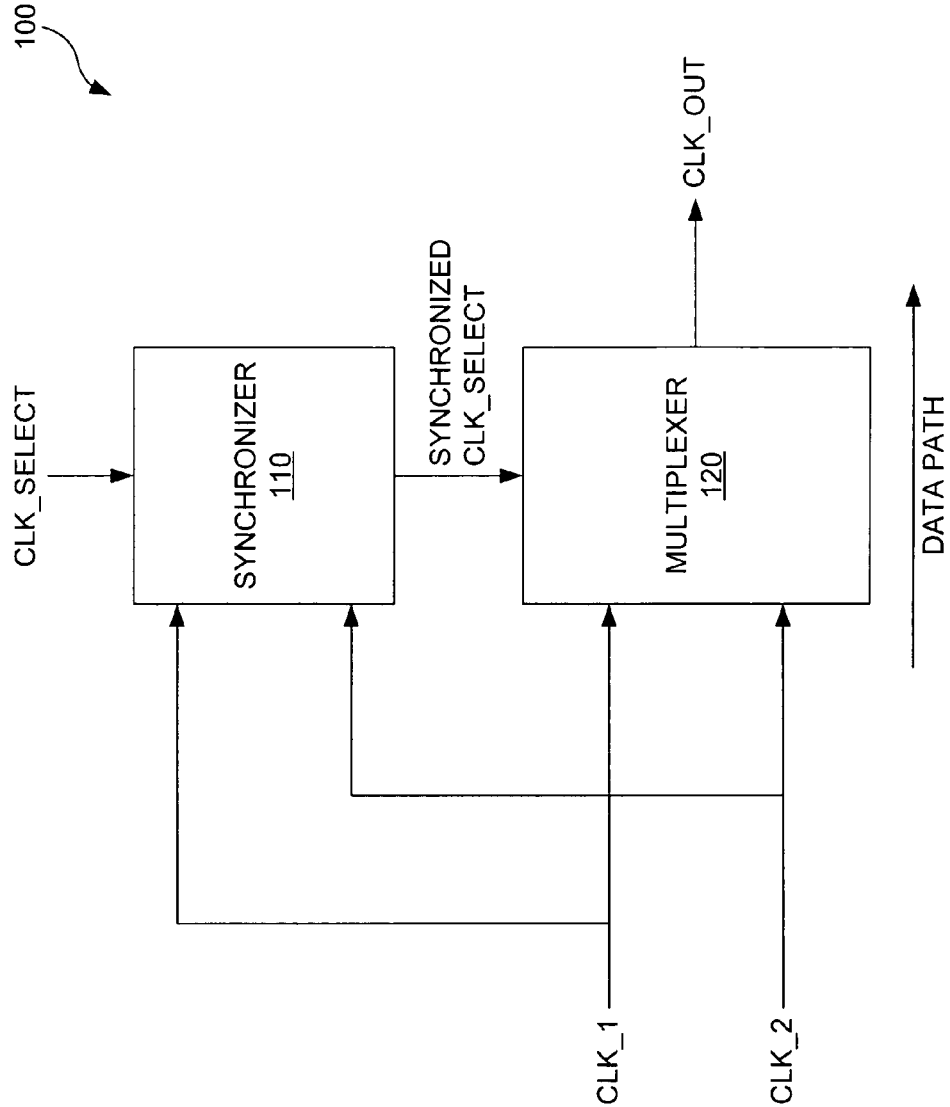
FIG. 1A schematically depicts a prior art glitch free multiplexer.

Turning now to FIG. 1A, disclosed is a conventional glitch free multiplexer. In FIG. 1A, two clock signals, Clk_1 and Clk_2 are received in a multiplexer 120. As is understood by those of skill in the art, a multiplexer is used to select amongst one of a plurality of inputs, to output as the selected input. In FIG. 1A, this would be Clk_1 or Clk_2 as a function of a selection signal. In FIG. 1A, this is the "synchronized Clk_Select" signal. FIG. 1A has a synchronizer 110 coupled to both of the Clk_1 and Clk_2 outputs. The synchronizer 110 also has a Clk_Select signal inputted into the synchronizer 110. From a synchronization of the Clk_1, Clk_2, and the Clk_Select signal, a Synchronized Clk_Select signal is generated which is employed by the multiplexer 120 to select and output one of the two Clk_1 or Clk_2 input frequencies at a time that is substantially simultaneous to a transition of the corresponding clock pulse.

In the system 100, the synchronizer 110 is employed to avoid "glitches" in the Clk_Out signal. For instance, the Clk_Select signal, if it were not synchronized, a user could command the multiplexer 120 to switch from a first clock frequency to a second clock frequency. However, the Clk_Select command could be received by the multiplexer 120 in the middle of a clock pulse. Without synchronization, this could create a glitch, that is, an anomalous duration clock pulse.

Synchronization can be generally defined as propagating a signal at substantially at the same time that correlates to characteristics of a timing signal, such as the rising or falling edge of a clock pulse. Synchronization, in FIG. 1A, can be generally defined as taking the three asynchronous signals, Clk_1, Clk_2 and Clk_Select, and generating another signal, the Synchronized Clk_Select, which has a fixed phase relationship with regards to Clk_1 and Clk_2.

To reiterate the above, synchronization is done with respect to the Clk_1 or Clk_2 signals only, in other words without a feedback from Clk_Out. In the system 100, typically synchronization with respect to either of the Clk_1 or Clk_2 signals will be sufficient to avoid the occurrence of a glitch at the Clk_out.

This is generally true for the following reason. The delay in the data path of FIG. 1A from Clk_1 or Clk_2 to Clk_Out is usually much less than the period of Clk_1 or Clk_2. Therefore, synchronizing with respect to Clk_1 or Clk_2 is generally sufficient for at least the purpose of eliminating a glitch.

Figure 1B:
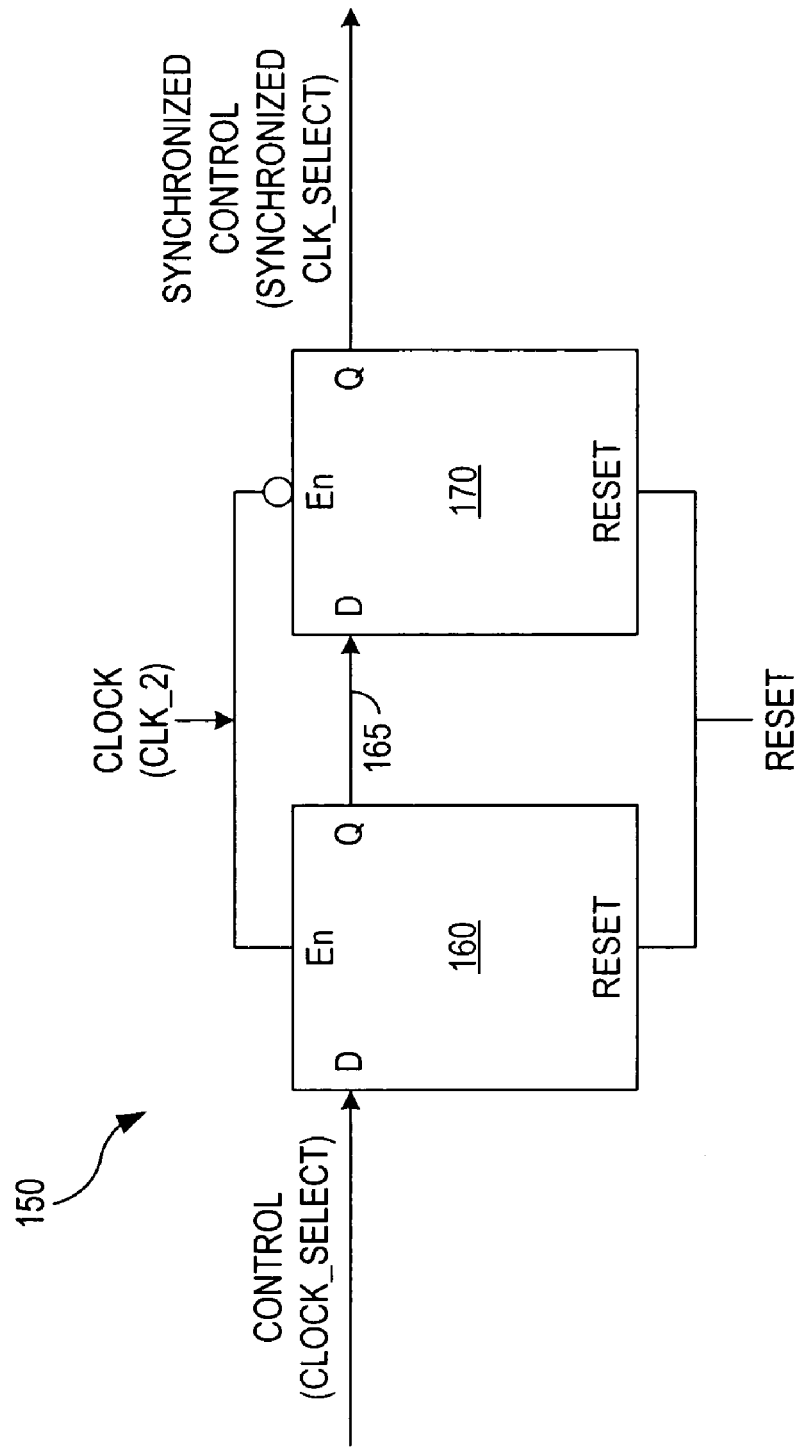
FIG. 1B illustrates a prior-art synchronizer.

Turning now to FIG. 1B, illustrated is a synchronizer that uses one input to illustrate some of the principles involved in FIG. 1A. Although illustrated in respect for the CLK_2 input, the following explanation can be expanded for 2 input clocks.

A control signal (such as Clock_Select) is input into a latch, such as a D type flip-flop 160. Generally, a latch propagates an input (such as control signal, the Clock_Select) through its output (called Q) if the latch is "enabled" (that is, it has received a "1" bit in the enable port). However, if the latch is disabled, the latch ignores the input (control), and instead outputs the previous value of the control value it received whilst it was enabled at the bit enable port. In other words, the latch acts as a "memory" of the last input signal that had a positive enablement.

In the synchronizer 150, the output of latch 160 is coupled to the input of a latch 170 through a data path 165. A clock signal (such as Clk_1 or Clk_2) is coupled to the enable port of the latch 160, and is coupled to the inverted enable port of the latch 170. The synchronizer works substantially as follows to ensure that the control signal Clock_Select is propagated as a synchronized control signal, synchronized in time to the Clk_2 signal.

In FIG. 1B, the latch 160 receives a control signal into its input and a clock signal into its enable port. If the clock signal is positive, the control signal is propagated over data path 165 to the latch 170. However, the D-latch 170 is disabled. Therefore, the synchronized control output is kept at the same value as it was before the clock transition to positive, as the latch 170 is reading this as a negative enable signal. Only when the clock signal (Clk_2) goes negative, which disables the latch 160 from outputting a change in data, does the latch 170 propagate the value on data path 165 to the output of the latch 170, and hence the synchronized control. Hence, the only time that the control value can be output by the synchronizer is if it is delayed to be simultaneous to the falling edge of a clock signal, thereby synchronizing the control signal Clock_Select with the clock signal.

Figure 2:
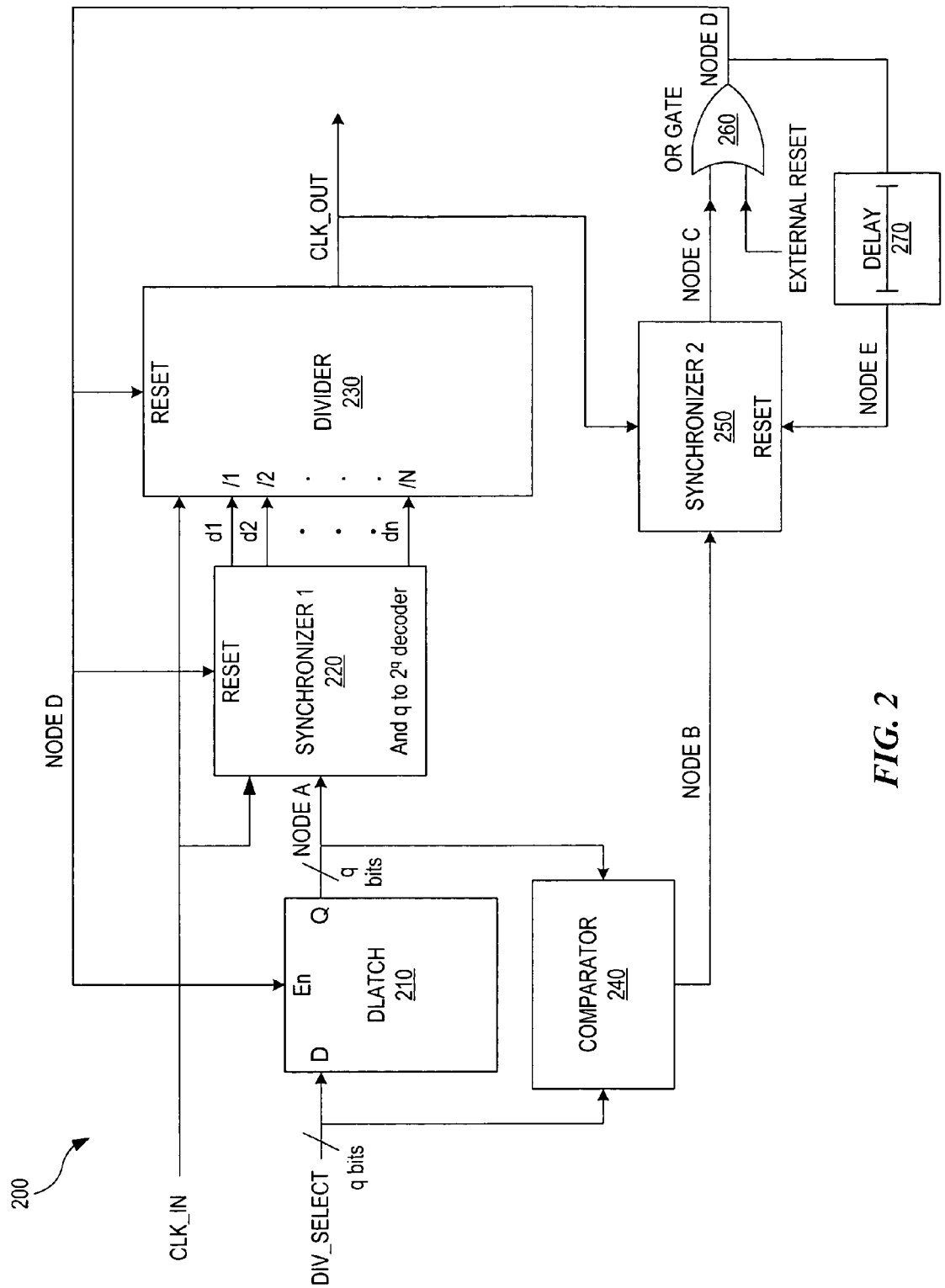
FIG. 2 illustrates a glitch free frequency divider.

Turning now to FIG. 2, illustrated is a glitch free divider architecture 200. The architecture 200 has a clock input signal (CLK_IN) and a division selection signal (DIV_SELECT). The CLK_IN signal is coupled to a frequency divider 230. The DIV_SELECT is coupled to the input of a D-latch 210 and a comparator 240. The output of the D-latch 210 (node "A") is coupled to a second input of the comparator 240 and the input of a synchronizer 1 220. The output of the comparator 240 (node "B") is coupled to the input of a synchronizer 2 250. The output of the synchronizer 1 220 is also coupled to the divider 230 through a divide by 1 channel ("/1"), a divide by 2 channel ("/2"), a divide by 3 channel ("/3"), and so on. The output of the divider 230 is a CLK_OUT signal, which is the divided clock output, as is illustrated in FIG. 3B. The synchronizer 1 220 has a q to $2^q$ decoder installed.

The CLK_OUT is also coupled to a second input of the synchronizer 2 250. The output of the synchronizer 2 250 ("node C") is coupled to an input of OR 260. A second input to the OR 260 is an external reset line. The output of the OR 260 (node "D") is coupled to a delay circuit 270. The delay circuit 270 is also coupled to the reset of the synchronizer 2 250.

Node D, the output of OR gate 260, is coupled to the reset of the divider 230, the reset of the synchronizer 1 220. Finally, node D is also coupled to the enable input of the D-latch 210.

In the system 200, the comparator 240 takes two signals, Div_Select and Node A, as input and provides an output at Node B. If the logic value of Node A is equal to the logic value of Div_Select, then Node B becomes a specified logic level (high or low). If the logic value of Node A is not equal to the logic value of Div_Select, then Node B becomes opposite logic to that of the case where logic value of Node A equals the logic value of Div_select.

D-latch (210) can be a standard D-latch with enable control. When enable is "asserted", the path between Div_Select and node A is transparent, and the Q output of D-latch 210 is equal to the Div_select value. When enable is de-asserted, the path between Div_Select and Node A is no longer transparent. In other words, signals will not flow across this path. However, Node A retains its value just prior to the de-assertion event. In the system 200, Div_Select and Node A each are "q" bits wide. Therefore, to accommodate "q" bits, "q" D-latches will be used in parallel, that is, 1 D-latch for each bit.

Synchronizer 1 220 synchronizes Node A with Clk_in such that its outputs d1, d2, . . . dn are synchronized outputs resulting from this event. Synchronizer 1 220 also has built into it an n to $2^n$ decoder. For example, if Node A is a 3 bit input, then Synchronizer 1 will generate 8 outputs (d1 to d8) corresponding with 8 different divider settings. The settings will then be inputted into the divider 230. Synchronizer 2 250 synchronizes Node B with Clk_Out such that the out put Node C is a synchronized version (with respect to Clk_Out) of the value at Node B.

Synchronizer 1 220 and Synchronizer 2 250 have reset inputs. When reset is asserted then regardless of the states of the other inputs, the outputs of the synchronizers are set to a pre-determined logic value.

In the system 200, the divider takes in Clk_In, and provides a frequency divided version of Clk_In at Clk_Out. The divider has /1. . . /n settings. These settings are selected by the outputs of Synchronizer 1 220. The divider 230 also has a reset input. When reset is asserted, regardless of the current state of the other divider inputs, the divider output, Clk_Out, is set to a predetermined logic value. Further, when the reset to Synchronizer 1 220 is asserted, its outputs d1 . . . dn are such that they put the output of the Divider Clk_Out to this predetermined logic value. In a further embodiment, the Or gate 260 is employed so that, if necessary, a manual reset can be performed using external reset bypassing all current operations.

An example of the operation of the glitch-free divider follows. In an illustrative example, the Divider setting is set to some value prior to t<0. Hence, at t<0, Div_Select and Node A are at the same value. Therefore, the logic value of node B will reflect this. For ease of illustration, this logic level is described as equal to 0. Further, the reset inputs to Synchronizer 1 220, Synchronizer 2 250, and Divider 230 are at logic 0. Hence, reset is disabled in all these blocks. Further, the enable input in D-latch 210, which is the same as the reset input into Synchronizer 1 220 and Divider 230 is also disabled.

At time t=0, the Div_Select value is changed. Because the enable input on D-latch 210 is disabled, the new Div_select value is not propagated to node A. Hence, immediately after Div_select is changed, Div_select value is not equal to node A. The comparator 240 detects an inequality has taken place and the logic value of node B will now be change to reflect this. In other words, the logic level of node B becomes 1.

Next, synchronizer 2 250 takes the new logic value on node B, and in a synchronized manner with Clk_out, passes this logic value to node C. Therefore, node C becomes logic 1. This causes in very short order node D to become 1. In the system 200, node D is the reset input into Synchronizer 1, and Divider. Hence, Synchronizer 1 220 and Divider 230 will be 'reset'. In the system 200, node D functions as the enable input of D-latch. Hence, the path between Div_select and node A is made transparent. That is node A now equals Div_select (the new divider setting). At substantially the same time, the comparator 240 now determines that the two inputs are identical and, therefore, node B becomes logic 0 again.

In the system 200, there is a feedback path from the synchronizer 2 250 back to the synchronizer 2 250, through the delay element 270, that feeds node D into the reset input of synchronizer 2 240. The delay element 270 adds enough delay such that Synchronizer 1, and Divider are reset, and D-latch is enabled for long enough duration such that node A=Div_Select. Once this is accomplished, Synchronizer 2 250 is reset. The delay element 270 is added to ensure all elements have arrived at their desired states.

In the system 200, the following has occurred so far. The node A has been set equal to the newly desired setting. The divider 230 is disabled in such a manner so that there are no glitches at Clk_out as a result of the resetting operation. Also, synchronizer 1 220 has been reset. In other words, its outputs d1 . . . dn are reset to a default value, and are ready to receive the new divider setting which has been uploaded onto node A.

When synchronizer 2 is reset through node E, node C becomes low. In other words, the reset input to the synchronizer 1 220 and the divider 230 are disabled. Also, the enable input of the D latch 210 is disabled. Hence, synchronizer 1 220 and the divider 230 are then ready to perform their synchronization and division task.

Synchronizer 1 220 then takes the new values of node A, synchronize it with Clk_in, and produce the new divider settings of d1 . . . dn. The divider 230 will then use these settings to result in a new frequency-divided signal at Clk_out.

To restate the above, by first carrying out synchronization with Clk_out, prior to disabling the divider 230 in the current setting, and then performing synchronization with respect to Clk_in prior to enabling the new divider 230 setting, the system 200 is able to avoid introducing glitches at the output of the divider, that is, Clk_out.

In one embodiment, the glitch free divider circuitry 200 operates through incorporation and employment of a pre-existing, that is, an "off the shelf" frequency divider circuit 230. In other words, the glitch free divider circuit 200 couples elements to the off the shelf divider circuit 230 to generate glitch-free output. Alternatively, the circuitry of FIG. 2 can be incorporated internally in an integrated glitch-free divider circuit 200. The incorporation can be set up during the design process.

Figure 3A:
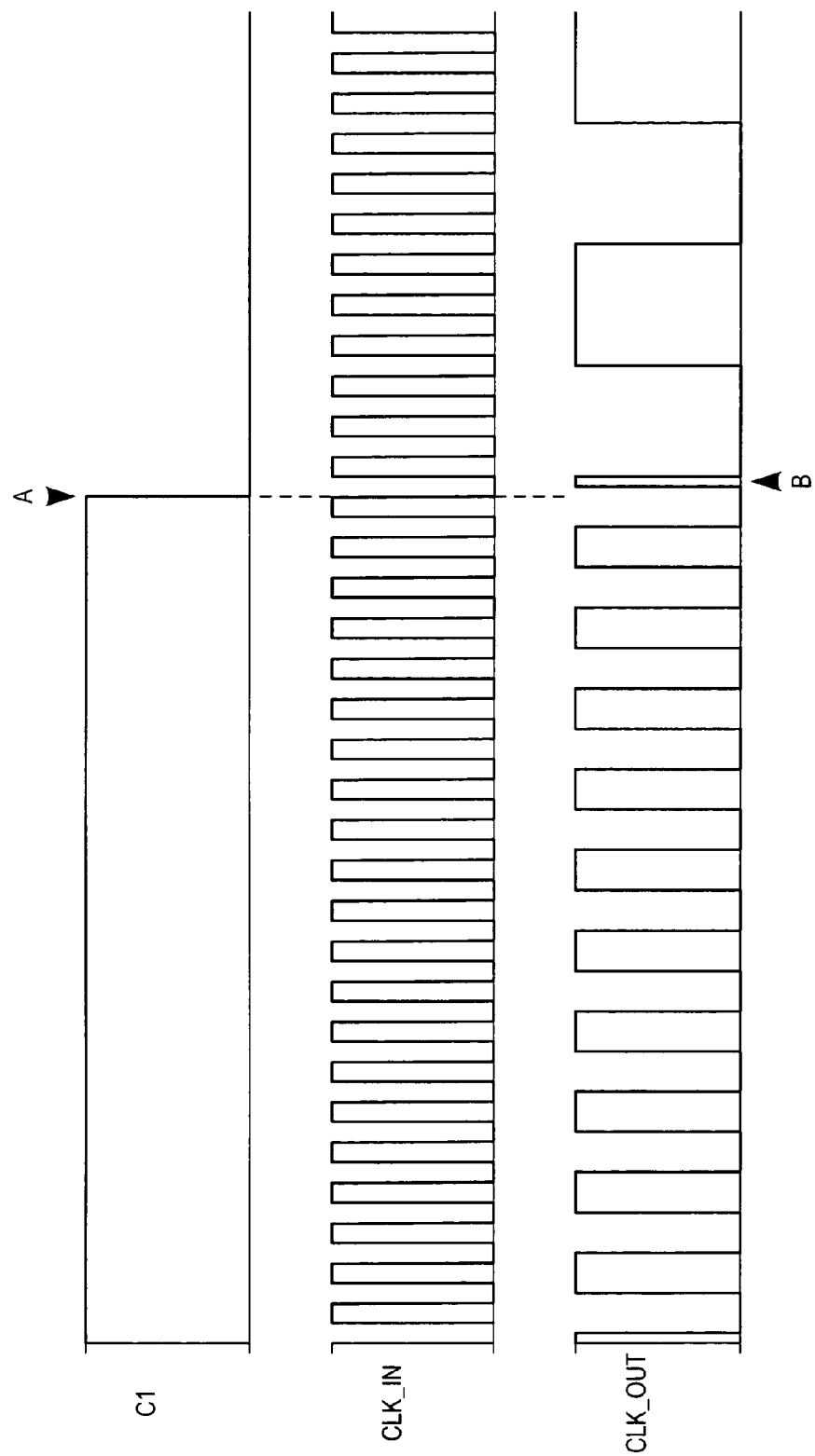
FIG. 3A illustrates a clock_out with a glitch because a frequency division has occurred.
Figure 3B:
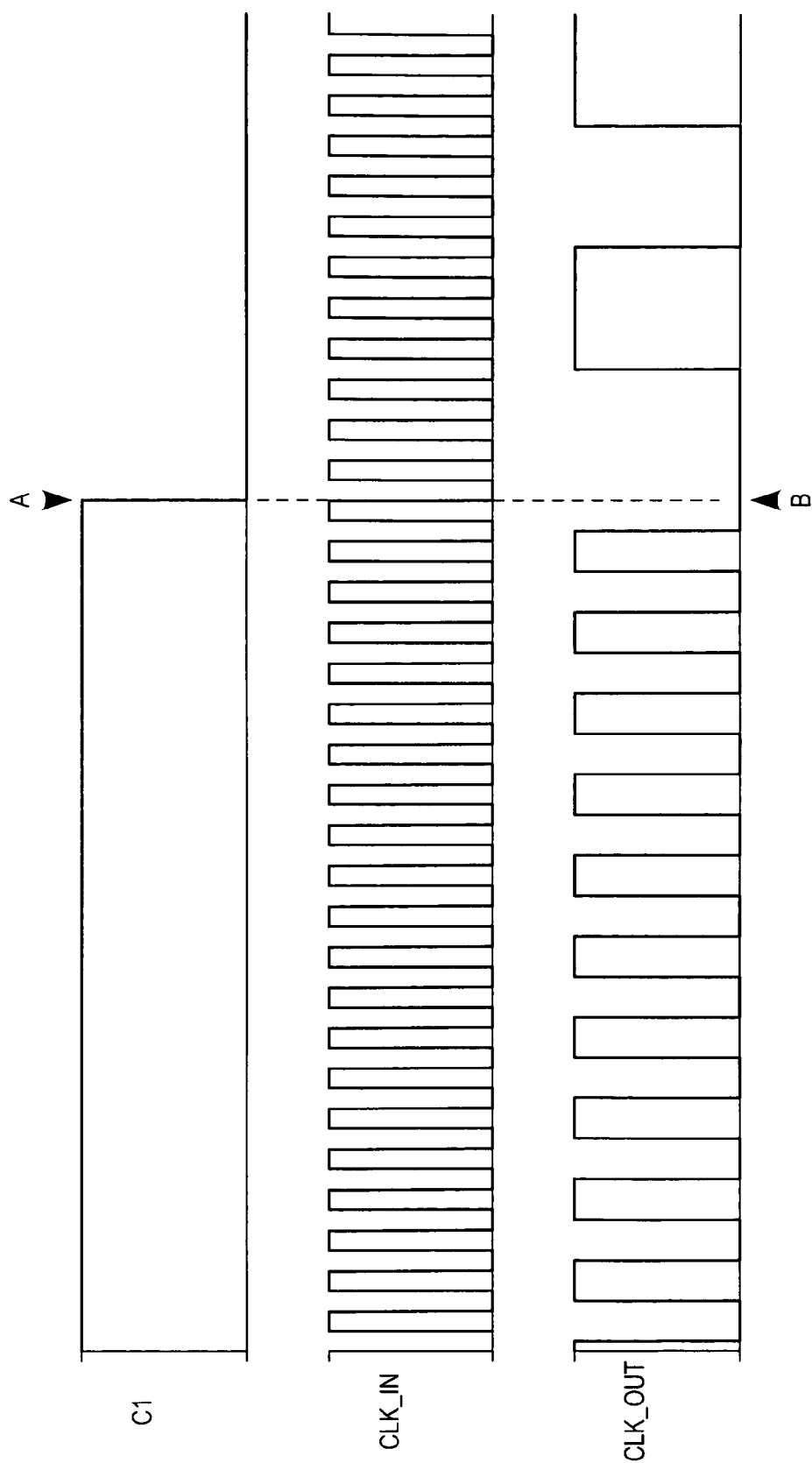
FIG. 3B illustrates a clock_out without a glitch, even though a change in frequency division has occured.

Turning now to FIG. 3A, illustrated is a graph of an output of a conventional frequency divider. In FIG. 3A, the control signal C1 corresponds to one of the Div_select bits that can change values. As is illustrated, when C1 transitions to 0 from a 1 value, a glitch is generated in the Clk_Out signal (point B in FIG. 3A).

Turning now to FIG. 3B, illustrated is one example of the output of the glitch free divider circuit 200. In FIG. 3B, the control signal C1 can correspond to one of the Div_select bits that can change values. As is illustrated in FIG. 3B, when there is a change of a divider ratio, no glitch is generated at Clk_out (point B in FIG. 3B).

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

What is claimed is:

1. A divider circuit for reducing anomalous output timing pulses, comprising:
   a division selection line;
   at least one latch coupled to the division selection line;
   a comparator coupled to the division selection line;
   an input clock line;
   a first synchronizer coupled to an output of the latch;
   a frequency divider coupled to an output of the synchronizer and the input clock line; and
   a second synchronizer coupled to an output of the comparator and an output of the frequency divider.

2. The circuit of claim 1, further comprising:
   an OR circuit coupled to an output of the second synchronizer.

3. The circuit of claim 2, further comprising a delay circuit coupled to an output of the OR circuit.

4. The circuit of claim 3, further comprising an output of the delay circuit coupled to a reset of the second synchronizer.

5. The circuit of claim 2, wherein an output of the OR circuit is coupled to a reset of the frequency divider.

6. The circuit of claim 2, wherein an output of the OR circuit is coupled to a reset of the first synchronizer.

7. The circuit of claim 2, wherein an output of the OR circuit is coupled to an enable terminal of the latch.

8. The circuit of claim 2, further comprising an external reset coupled to an input of the OR gate.

9. The circuit of claim 1, wherein the frequency divider is a pre-existing component.

10. The circuit of claim 1, wherein at least the frequency divider and the first and second synchronizers into the same integrated circuit chip.

11. A computer program product for reducing anomalous timing pulses, the computer program product having a medium with a computer program embodied thereon, the computer program comprising:
   computer code for inputting data over a division selection line, wherein a latch is coupled to the division selection line, and wherein a comparator is coupled to the division selection line;
   computer code for inputting data over an input clock line;
   computer code for synchronizing an output of the latch;
   computer code for frequency dividing an output of a first synchronizer; and
   computer code for synchronizing an output of the comparator and an output of a frequency divider.

12. A processor for reducing anomalous timing pulses, the processor including a computer program comprising:
   computer code for inputting data over a division selection line, wherein a latch is coupled to the division selection line, and wherein a comparator is coupled to the division selection line;
   computer code for inputting data over an input clock line;
   computer code for synchronizing an output of the latch;
   computer code for frequency dividing an output of a first synchronizer; and
   computer code for synchronizing an output of the comparator and an output of a frequency divider.

13. A method of generating glitch-free output, comprising:
   receiving a first division selection value into a latch;
   receiving a first division selection value into a comparator;
   outputting a first value from the latch;
   comparing the first division selection value and the first value;
   generating a comparison value as a function of the comparison;
   synchronizing the comparison value with an output of a divider;
   outputting the synchronized comparison value; and
   applying a reset value to the latch as a function of the synchronized comparison value; and
   applying a reset value to the divider as a function of the synchronized comparison value.

14. The method of claim 13, further comprising generating a delayed synchronized comparison value.

15. The method of claim 14, further comprising applying the delayed synchronization comparison value to a reset of a first synchronizer which performs the outputting of the synchronized comparison value.

16. The method of claim 13, further comprising synchronizing the output of the latch to a timing signal.

17. The method of claim 16, further comprising employing a second synchronizer for synchronization.

18. The method of claim 16, further comprising applying the synchronized output of the latch to an input of the divider.

19. The method of claim 13, further comprising applying an output of a first synchronizer to a reset of a second synchronizer.

20. The method of claim 13, wherein the latch, the comparator, and the divider reside within a computer.

* * * * *